United States Patent Office 3,361,563
Patented Jan. 2, 1968

3,361,563
CYANURIC CHLORIDE SENSITIZER FOR HALOGEN FREE-RADICAL COLOR-FORMING COMPOSITIONS

Ernst August Hackmann, Roland Moraw, and Johannes Munder, Wiesbaden-Biebrich, Germany, assignors to Kalle Aktiengesellschaft, Wiesbaden-Biebrich, Germany, a corporation of Germany No Drawing. Filed Sept. 28, 1964, Ser. No. 399,835
Claims priority, application Germany, Sept. 28, 1963, K 50,948
7 Claims. (Cl. 96—48)

The present invention relates to photosensitive reproduction materials and refers more particularly to specially sensitized compositions for photosensitive materials.

Among the materials suitable for direct image reproduction by imagewise exposure of a photosensitive layer is a material in which a photosensitive layer contains a film-forming plastic, an arylamine or an N-substituted nitrogen compound, and a halogen compound that forms a free halogen radical on exposure. The free halogen radical formed by exposure reacts spontaneously with the substantially colorless arylamine or N-vinyl compound to form a dye. Thus, upon imagewise exposure, a negative of the transparency is obtained. The resulting image may be fixed by a heat treatment. The photosensitive layer of such material may contain further constituents such as stabilizers that inhibit undesired dye formation in the dark, and a small amount of alkylamine, zinc oxide, or an agent such as polyhydroxyphenol or aminophenol, that prevents fogging in the unexposed areas of the printing paper. Supports conventionally used in reproduction such as glass plates, paper, metal plates, or plastic films may be used.

Combinations preferably used in the known processes are diphenylamine and carbon tetrabromide, and N-vinyl carbazole and carbon tetrabromide, though other materials are also suitable. Further details are described in German auslegeschrift 1,134,587 and in U.S. Patent 3,042,517.

It has now been found that these reproduction materials are substantially more photosensitive if their photosensitive layer contains cyanuric chloride. It has further been observed that these reproduction materials are also suitable when the photosensitive layer does not contain a plastic material. Furthermore, the photosensitive combination of arylamine or N-vinyl-substituted compound, halogen compound, and cyanuric chloride may also be incorporated in a plastic film which may serve at the same time as the support.

While it is true that known photosensitive reproduction materials contain a sensitizer which may be an ultraviolet light-absorbing substance such as benzil, benzoin, stilbene, and benzophenone, it was found that materials containing cyanuric chloride as sensitizer were markedly superior.

Another advantage of reproduction materials containing cyanuric chloride is the fact that the cyanuric chloride may be incorporated in the photosensitive layer a short time before exposure by exposing the layer to vapors of cyanuric chloride. When this procedure is used, cyanuric chloride may be incorporated into the layer together with the halogen compound by exposing the layer to the mixed vapors of the two substances. The process for image production, including the incorporation of the halogen compound alone in the photosensitive layer a short time before exposure, is described herein.

One object of the present invention is to provide a photosensitive reproduction material which has improved sensitivity and fog resistance over the prior art materials.

Another object is to provide methods for making and using the photosensitive reproduction material having the improved sensitivity and fog resistance.

Other objects will become apparent in the course of the following specification.

Photosensitive reproduction materials according to this invention which contain carbon tetrabromide, diphenylamine, and cyanuric chloride produce on exposure under a transparency a negative image of a pleasant violet shade. This constitutes a tone variation compared with known materials of the same class that do not contain cyanuric chloride in the layer and which give bluish images. Such a variation in tone is preferred for its greater contrast.

Reproduction materials containing N-vinyl carbazole, carbon tetrabromide, and cyanuric chloride produce, after exposure but not until after heat-fixing, brown negative images. In this case, cyanuric chloride stabilizes the image against undesirable discoloration in the unexposed areas of the reproduction material during the heat-fixing step. In the absence of cyanuric chloride, fogging occurs on prolonged heating. When the fixing time is short, prints that do not contain cyanuric chloride are not very stable to daylight. In both cases the presence of cyanuric chloride counteracts fogging.

It is also significant that photosensitive papers coated with a solution of halogenated hydrocarbon, N-vinyl carbazole, and cyanuric chloride produce a better balanced image than do papers produced in the same manner but without the addition of cyanuric chloride.

The following examples further illustrate the present invention and are not intended to limit its scope.

*Example 1*

A solution of five grams of N-vinyl carbazole, eight grams of carbon tetrabromide, and two grams of cyanuric chloride in twenty-five milliliters of trichloroethylene was used to coat paper on one side. The paper was then dried at room temperature. The coated paper was placed under a transparency and a glass plate, and then exposed to the light of a high pressure mercury lamp. The print was then developed and fixed by heating it for three minutes at 110° C. A brown negative of the transparency was obtained.

Compared with material prepared in an otherwise identical manner but without cyanuric chloride, only a third of the exposure time was needed. That is, the cyanuric chloride material was at least three times more sensitive to the actinic radiation. In addition, the image produced on the paper containing cyanuric chloride had better balance, especially in the medium-tone areas. Furthermore, the usual yellowing of prints fixed for too short a time and those fixed for too long a time was substantially reduced.

*Example 2*

The procedure of Example 1 was followed except that the coating solution contained neither carbon tetrabromide nor cyanuric chloride. Instead, these two components were applied by placing the paper to which the coating solution had been applied for sixty seconds in a chamber filled with the vapors of these two components at a temperature of 60° C. The result was analogous to that obtained in Example 1.

*Example 3*

A solution of five grams of N-vinyl carbazole, eight grams of carbon tetrabromide, and five grams of polystyrene in twenty-five milliliters of trichloroethylene was used to coat paper on one side. The paper was then dried at room temperature. Exposure was performed with a high pressure mercury lamp through a transparency and a glass plate. Development and fixing consisted in heating for three minutes at 110° C. A clear, brown negative image of the transparency was obtained.

When cyanuric chloride was included in the layer, the exposure time was reduced to one-fourth to produce the same results.

*Example 4*

The same procedure as in Example 3 was used, except that instead of paper a glass plate was coated. Analogous results were obtained.

*Example 5*

The same procedure as in Example 3 was used, except that the coating solution contained neither carbon tetrabromide nor cyanuric chloride. Instead, these components were incorporated into the layer as described in Example 2. The results were similar to those of Example 3.

*Example 6*

A glass plate was coated as described in Example 5. The results were similar to those of Example 4.

*Example 7*

Paper was coated on one side with a solution of 5 g. of diphenylamine, 8 g. of carbon tetrabromide, and 2 g. of cyanuric chloride in 25 milliliters of trichloroethylene. The paper was dried at room temperature and then exposed through a master and a glass plate to the light of a high-pressure mercury lamp. A violet negative of the transparency was obtained. This was fixed by heating for three minutes at 110° C.

A paper having a layer which did not contain cyanuric chloride but which was otherwise coated in an identical manner required three times the exposure and produced blue images.

*Example 8*

Paper was coated as described in Example 7, but the coating solution contained neither carbon tetrabromide nor cyanuric chloride. These two components were applied as described in Example 2 to the coated paper by exposure to the vapors for 60 seconds at 60° C. The result was similar to that of Example 7.

*Example 9*

Example 7 was repeated with 5 g. of polystyrene added to the coating solution. The result was similar to that of Example 7.

*Example 10*

Using the method of Example 9, a glass plate instead of paper was coated. A similar result was achieved.

*Example 11*

The procedure of Example 9 was used, except that the coating solution contained neither carbon tetrabromide nor cyanuric bromide. These two components were applied to the paper by vaporizing as described in Example 2 for sixty seconds at 60° C. The result resembled that of Example 9.

*Example 12*

The procedure of Example 11 was adopted, except that a glass plate was coated instead of paper. A similar result was obtained.

*Example 13*

Paper was coated on one side with a solution of 5 g. of diphenylamine, 0.25 g. of iodoform, and 1 g. of cyanuric chloride in 25 milliliters of trichloroethylene. The paper was dried at room temperature, exposed through a transparency and a glass plate to the light of a high-pressure mercury lamp, and then fixed by heating for three minutes at 110° C. An orange-colored negative of the transparency was obtained. Material which did not contain cyanuric chloride, but otherwise was identical, required three times the exposure and gave images of a brownish tint.

*Example 14*

A cellulose acetate film was immersed for three minutes in a solution of 5 g. of diphenylamine in 25 milliliters of trichloroethylene, dried at room temperature, and then vaporized with carbon tetrabromide and cyanuric chloride as described in Example 2 for 60 seconds at 60° C. The film was covered with a transparency and a glass plate, exposed to the light of a high-pressure mercury lamp, and then fixed by heating for three minutes at 110° C. A violet negative of the transparency was obtained.

A material which did not contain cyanuric chloride but which was otherwise identical required almost twice the exposure time and gave blue images.

*Example 15*

Four grams of N-vinyl carbazole, eight grams of carbon tetrabromide, and two grams of cyanuric chloride were dissolved in 100 milliliters of a 10% solution of polystyrene in trichloroethylene and coated on an anodized aluminum plate. The dry sensitized plate was exposed through a transparency and a glass plate to the light of a high-pressure mercury lamp, and then developed and fixed by heating for three minutes at 110° C. A brown negative of the transparency was obtained.

A similar result was obtained with a brushed aluminum foil coated in the same manner.

The material which did not contain cyanuric chloride but which was otherwise identical required four or five times the exposure.

*Example 16*

An anodized aluminum plate was coated with a solution (prepared at room temperature) of 0.1 g. of polystyrene, 1.6 g. of eicosane, 1 g. of N-vinyl carbazole, 0.5 g. of cyanuric chloride, and 1 g. of carbon tetrabromide in 99 milliliters of benzene. The dried plate was exposed under a carbon arc lamp for two minutes through a negative transparency and then developed with a solvent mixture of four parts by volume of diethylene glycol monoethyl ether and one part by volume of dimethyl formamide, which caused the unexposed areas of the image to dissolve whereas the exposed areas had become insoluble and remained on the plate. The latter areas accepted greasy printing ink so that the plate could be used as a printing plate in a printing machine and prints obtained therefrom.

When cyanuric chloride was omitted from an otherwise identical coating solution, the exposure had to be increased to about eight minutes to enable the plate to be developed after exposure.

It is apparent that the described examples are capable of many variations and modifications. All such variations and modifications are to be included within the scope of the present invention.

What is claimed is:

1. A photosensitive reproduction material which comprises a support and a photosensitive layer coated on said support, said layer comprising a substantially colorless color-former reactive in the presence of a halogen free-radical to form a color dye, an organic halogen compound capable of generating halogen free-radicals upon the incidence of ultra violet light, and cyanuric chloride.

2. A material in accordance with claim 1 in which said support is a member selected from the group consisting of paper, glass plates, cellulose acetate film, anodized aluminum plates, and aluminum foil.

3. A material in accordance with claim 1 in which said substantially colorless color-former is a member selected from the group consisting of diphenylamine and N-vinyl carbazole.

4. A material in accordance with claim 1 in which said organic halogen compound is a member selected from the group consisting of carbon tetrabromide and iodoform.

5. A material in accordance with claim 1 in which said layer comprises a member selected from the group consisting of polystyrene and polystyrene with eicosane.

6. A method of making a photographic reproduction which comprises the steps of:

coating a support with a substantially colorless color-former selected from the group consisting of diphenylamine and N-vinyl carbazole; exposing the coated support to the vapors of cyanuric chloride and an organic halogen compound selected from the group consisting of carbon tetrabromide and iodoform; exposing the support imagewise to acetinic radiation; and heating the support to fix the image therein.

7. A method of making a printing plate, which comprises the steps of:

coating an anodized aluminum plate with a solution comprising polystyrene, eicosane, N-vinyl carbazole, cyanuric chloride, and carbon tetrabromide; exposing the plate imagewise to actinic radiation; developing the plate with a solution comprising diethylene glycol monoethyl ether and dimethyl formamide to remove unexposed areas of the coating from the plate.

References Cited

UNITED STATES PATENTS

| | | | |
|---|---|---|---|
| 3,042,517 | 7/1962 | Wainer | 96—90 X |
| 3,046,125 | 7/1962 | Wainer | 96—90 X |
| 3,046,209 | 7/1962 | Sprague | 96—90 |
| 3,079,258 | 6/1963 | Agruss | 96—90 |
| 3,082,086 | 3/1963 | Sprague | 96—90 |
| 3,121,632 | 2/1964 | Sprague | 96—90 |

NORMAN G. TORCHIN, *Primary Examiner.*

C. E. DAVIS, D. PRICE, *Assistant Examiners.*